(12) United States Patent
Chu et al.

(10) Patent No.: US 6,804,966 B1
(45) Date of Patent: Oct. 19, 2004

(54) THERMAL DISSIPATION ASSEMBLY EMPLOYING THERMOELECTRIC MODULE WITH MULTIPLE ARRAYS OF THERMOELECTRIC ELEMENTS OF DIFFERENT DENSITIES

(75) Inventors: Richard C. Chu, Hopewell Junction, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/607,061

(22) Filed: Jun. 26, 2003

(51) Int. Cl.[7] ................ F25B 21/02; F25D 23/12; H05K 7/20
(52) U.S. Cl. ............... 62/3.7; 62/259.2; 361/688; 361/687
(58) Field of Search ................ 62/3.7, 259.2, 62/3.2, 3.6; 361/705, 690, 718, 676, 688, 687, 689, 697; 165/104.21, 104.33, 80.3

(56) References Cited

U.S. PATENT DOCUMENTS

| | | | |
|---|---|---|---|
| 5,715,684 A | 2/1998 | Watanabe et al. | 62/3.2 |
| 6,000,225 A | 12/1999 | Ghoshal | 62/3.7 |
| 6,230,497 B1 | 5/2001 | Morris et al. | 62/3.7 |
| 6,250,085 B1 | 6/2001 | Tousson | 62/3.7 |
| 6,282,907 B1 | 9/2001 | Ghoshal | 62/3.7 |
| 6,396,700 B1 | 5/2002 | Chu et al. | 361/705 |
| 6,424,533 B1 | 7/2002 | Chu et al. | 361/719 |
| 6,489,551 B2 | 12/2002 | Chu et al. | 136/230 |
| 6,548,894 B2 | 4/2003 | Chu et al. | 257/706 |

*Primary Examiner*—Chen-Wen Jiang
(74) *Attorney, Agent, or Firm*—Andrew J. Wojnicki, Esq.; Kevin P. Radigan, Esq.; Heslin Rothenberg Farley & Mesiti P.C.

(57) ABSTRACT

A thermoelectric assembly is provided for an electronic device, having a surface with a non-uniform thermal distribution between at least one first region and at least one second region, with the at least one first region having a higher heat flux than the at least one second region. The assembly includes at least one first area of thermoelectric elements and at least one second area of thermoelectric elements, which are configured to align over the at least one first region of higher heat flux, and the at least one second region, respectively, when the assembly is coupled to the device. The at least one first area of thermoelectric elements includes a greater density of thermoelectric elements than the at least one second area of thermoelectric elements for handling the higher heat flux.

17 Claims, 3 Drawing Sheets

THERMAL DISSIPATION ASSEMBLY EMPLOYING THERMOELECTRIC MODULE WITH MULTIPLE ARRAYS OF THERMOELECTRIC ELEMENTS OF DIFFERENT DENSITIES

FIELD OF THE INVENTION

The present invention is directed to cooling assemblies and other apparatus used for removing heat from electronic devices. More particularly, the present invention is directed to a thermal dissipation assembly for an electronic device employing a thermoelectric module with multiple arrays of thermoelectric elements of different densities. The multiple arrays of thermoelectric elements allow customization of the cooling capacity of the thermoelectric module when the thermoelectric module is to be coupled to an electronic device, such as an integrated circuit chip, having a non-uniform heat flux across a surface thereof.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly high clock frequencies. Nonetheless, it is also known that runaway thermal conditions and excessive heat generated by chips is a leading cause for failure of chip devices. Furthermore, it is anticipated that the demand for heat removal for these devices will increase indefinitely. Accordingly, it is seen that there is a large and significant need to provide useful cooling mechanisms for electronic circuit devices.

Thermoelectric cooling elements operate electronically to produce a cooling effect. By passing a direct current through the elements of a thermoelectric device, a temperature difference is produced across the device which is contrary to that which would be expected from Fourier's Law.

At one junction of the thermoelectric element both holes and electrons move away, toward the other junction, as a consequence of the current flow through the junction. Holes move through the p type material and electrons through the n type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water) or provide greater heat removal capacity for a given cold plate or component temperature. When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

SUMMARY OF THE INVENTION

Conventional configurations of large thermoelectric assemblies are nonetheless seen herein to be unnecessarily limiting in terms of their application to the transfer of thermal energy. Thus, while the use of thermoelectric devices is seen to provide a means for the solid state cooling of adjacent electrical devices, their efficiency has been less than optimal.

In addition, complementary metal oxide semiconductor (CMOS) semiconductor processing has progressed to the point where large logic units (such as processors) and their associated control and support circuits (e.g., memory) can today be placed on a single integrated circuit chip. From a thermal view point, this results in a chip with a highly non-uniform heat flux distribution. A relatively high heat flux is generated in the processor core region(s) and a relatively low heat flux is produced in the control/support region(s). In fact, the processor core region heat flux can be as much as 15 times greater than that of the other regions. Thermal paste conduction cooling schemes are not well suited to handle such disparate fluxes. They result in an equally disparate circuit temperature distribution, and more importantly, a much higher absolute junction temperature within the high heat flux regions.

Therefore, to summarize, the present invention provides herein in one aspect a thermal dissipation assembly for facilitating cooling of an electronic device, such as an integrated circuit chip. The thermal dissipation assembly includes a thermoelectric assembly or module which is configured to couple to a surface of a heat generating component, such as the electronic device. The heat generating component has a nonuniform thermal distribution across the surface thereof between at least one first region of the surface and at least one second region of the surface, wherein the at least the one first region has higher heat flux than the at least one second region. The thermoelectric assembly includes at least one first area of thermoelectric elements and at least one second area of thermoelectric elements. The at least one first area of thermoelectric elements is configured to at least partially align over the at least one first region of higher heat flux when the thermoelectric assembly is coupled to the surface of the heat generating component, and the at least one second area of thermoelectric elements is configured for at least partial alignment over the at least one second region of lower heat flux when the thermoelectric assembly is coupled to the surface of the heat generating component. Further, the at least one first area of thermoelectric elements has a greater density of thermoelectric elements than the at least one second area of thermoelectric elements.

In another aspect, an electronic module is provided which includes an electronic device having a non-uniform thermal distribution across a surface thereof between at least one first region of the surface and at least one second region of the surface, wherein the at least one first region has higher heat flux than the at least one second region. The module also includes a thermoelectric assembly coupled to the surface of the electronic device. The thermoelectric assembly includes at least one first area of thermoelectric elements and at least one second area of thermoelectric elements. The at least one first area of thermoelectric elements is aligned over the at least one first region of higher heat flux, and the at least one second area of thermoelectric elements is aligned over the at least one second region of lower heat flux. Further, the at least one first area of thermoelectric elements has a greater density of thermoelectric elements than the at least one second area of thermoelectric elements.

In a further aspect, a method of fabricating a thermal dissipation assembly for an electronic device is provided. The method includes: providing a thermoelectric assembly configured to couple to a surface of an electronic device, the electronic device having a non-uniform thermal distribution across its surface between at least one first region of the surface and at least one second region of the surface, wherein the at least one first region has a higher heat flux than the at least one second region; and wherein the providing of the thermoelectric assembly includes providing at least one first area of thermoelectric elements and at least one second area of thermoelectric elements. The at least one first area of thermoelectric elements is configured for at least partial alignment over the at least one first region of higher heat flux when the thermoelectric assembly is coupled to the surface of the electronic device, and the at least one second area of thermoelectric elements is configured for at least partial alignment over the at least one second region of lower heat flux when the thermoelectric assembly is coupled to the surface of an electronic device, and wherein the at least one first area of thermoelectric elements has greater density than the at least one second area of thermoelectric elements.

To restate, provided herein is a thermal dissipation assembly employing a thermoelectric assembly or module having multiple arrays of thermoelectric elements with different densities. The thermoelectric assembly is useful in cooling a heat generating component, such as a integrated circuit chip. A thermoelectric assembly in accordance with an aspect of the present invention allows handling of high heat flux zones on a component, while cooling the entire component to acceptable temperatures, thereby establishing a more uniform temperature distribution on the component. This advantageously facilitates integrated circuit design and operation. Additionally, the thermoelectric assembly presented establishes lower circuit temperatures for a given heat load, and employs a lower power consumption in achieving the desired cooling, i.e., provides a more efficient cooling approach.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
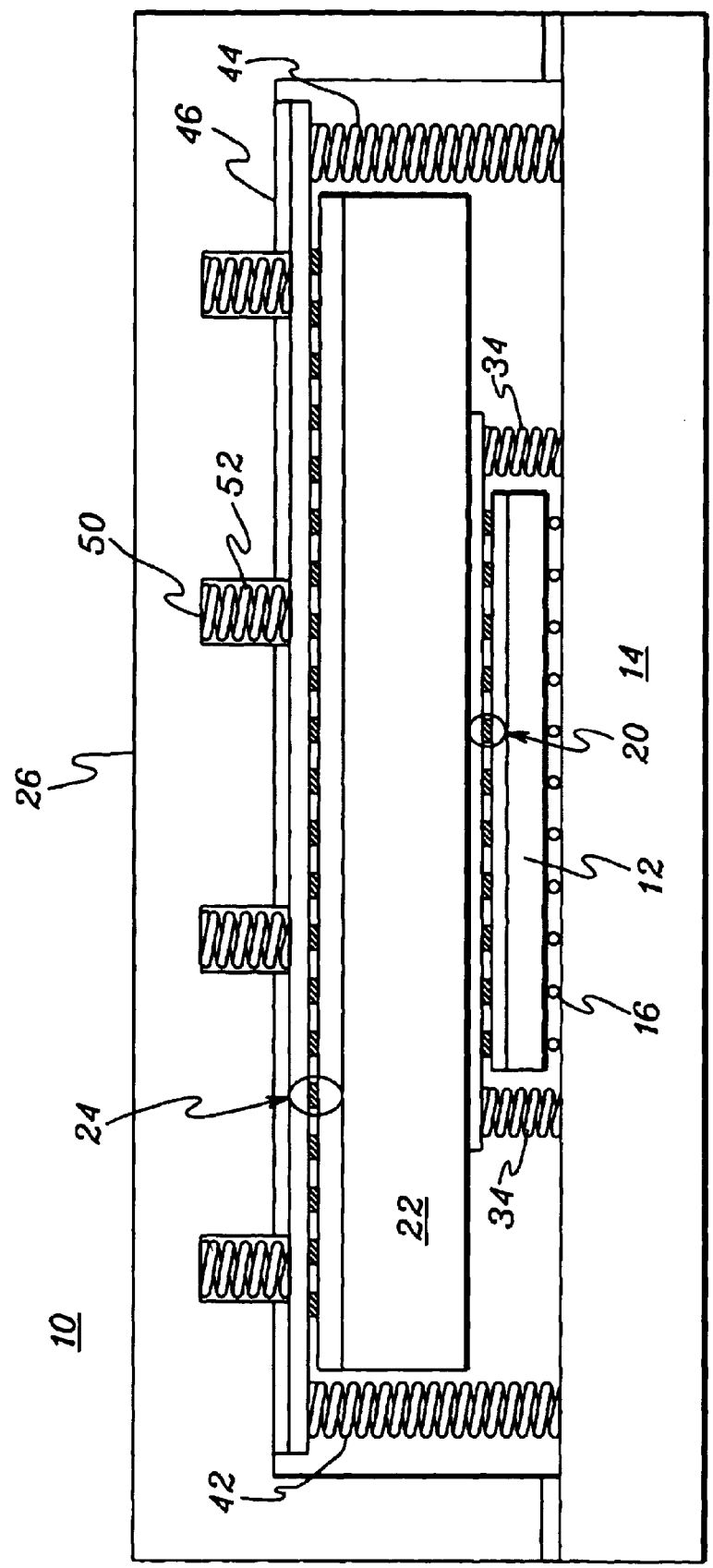
FIG. 1 is a partial elevational view illustrating one embodiment of an electronic module to employ a thermal dissipation assembly, in accordance with an aspect of the present invention.

FIG. 1 depicts one embodiment of a cooled electronic module, generally denoted 10, which can employ a thermal dissipation assembly in accordance with an aspect of the present invention. Module 10 includes at least one electronic device 12, such as an integrated circuit chip, which in this embodiment is mounted on a substrate 14 and is electrically connected to circuitry on or within substrate 14 via a conventional metal connects, such as solder bumps 16.

In this embodiment, the thermal dissipation assembly includes a first thermoelectric assembly or module 20 and a second thermoelectric assembly or module 24. As noted above, it is well known that by passing direct current through a series of thermoelectric elements or couples, one side of the thermoelectric will transfer heat to the other side. Essentially, heat is "electronically" pumped from the cold side to the hot side. In the embodiment of FIG. 1, the cold side of cooling assembly 20 is thermally coupled to an upper surface of electronic device 12, for example, employing an appropriate oil or phase change interface material, such as Chomerics' Thermflow™ T310 material marketed by Parker Hannifin Corporation of Woburn, Mass.

Heat which flows out the hot side of a set of thermoelectric couples will be comprised of the active heat being pumped from device 12, in addition to the power dissipation of the thermoelectric couples in performing the electronic heat pumping action. The second thermoelectric assembly 24 is provided to handle this total heat load. The temperature difference across the two thermoelectric assemblies 20, 24, will be additive. To provide adequate heat-pumping capability and to maintain a temperature difference across the second stage, the number of thermoelectric elements for the second stage can be greater and occupy a larger surface area than the surface area occupied by the first stage.

In this example, heat flows through the first thermoelectric assembly 20 to the second thermoelectric assembly 24 and thereafter to a thermally conductive cap 26 which may be coupled to a cold plate (not shown). Heat is therefore dissipated through a second main surface of thermoelectric assembly 20 and absorbed by a first main surface of thermoelectric assembly 24 for transfer to cap 26. In the embodiment depicted, a thermal space transformer 22 is disposed between these opposing surfaces of the cascaded multi-stage thermoelectric cooling assembly.

Note that although a thermoelectric assembly, in accordance with an aspect of the present invention, is described above for a two-staged thermal dissipation assembly such as depicted in FIG. 1, the concepts presented can be readily employed with a single stage thermoelectric assembly, with or without a space transformer. Alternatively, the concepts can be extended to multi-stage assemblies having more than two stages. In such a case, multiple thermal space transformers might be employed, with each thermal space transformer being disposed between a different pair of adjacent, cascaded thermoelectric stages.

Continuing with the cooled electronic module of FIG. 1, a thermal paste 46 can be employed at the interface between the second thermoelectric assembly 24 and thermally conductive cap 26. If the first thermoelectric assembly 20 has a silicon substrate, a solder or epoxy interface could be formed between electronic device 12 and first thermoelectric assembly 20 as well to improve thermal performance without increasing the likelihood of fatigue cracking due to a perfect coefficient of thermal expansion match (i.e., zero mismatch) between the structures.

Electrical power can be provided to the thermoelectric assemblies by employing power lines (not shown) conventionally disposed within substrate 14. For example, lands can be provided on the upper surface of substrate 14 which are tied electrically to power and ground planes within the substrate. The first thermoelectric assembly 20 can comprise a thin film thermoelectric device having a first plate and a second plate between which the thermoelectric elements are disposed as described hereinbelow. If desired, electrical connection can be made to the first thermoelectric assembly by using electrically conductive springs 34 connected to the second plate of the first thermoelectric assembly. Alternatively, wire bond contacts could be made between the thermoelectric assembly and the substrate. Similarly, second thermoelectric assembly 24 can comprise in one embodiment a thin film thermoelectric device, again having a first support plate and a second support plate between which the thermoelectric elements are disposed. Electrically conductive springs 44 could similarly be used to make electrical connection to the second thermoelectric assembly.

In the embodiment of FIG. 1, springs 52 are disposed within recesses 50 formed within cap 26 in order to maintain the entire thermal dissipation assembly in thermal and mechanical contact. Preferably, the forces between springs 34 and 44 pushing up and compressive forces of springs 52 pushing down at least balance. Alternatively, springs 52 can apply a slightly greater force to ensure good thermal contact between electronic device 12 and the thermal dissipation assembly.

The structure of FIG. 1 is depicted herein by way of example only, the thermoelectric assembly disclosed can be readily applied to other dissipation assemblies for cooling various heat generating components within an electronic device or electronic module.

Generally stated, represented herein is a thermal dissipation assembly designed to balance temperature across an integrated circuit chip (i.e., minimize the device temperature difference) while also minimizing the absolute device temperature itself This is accomplished using a thermoelectric assembly configured to coupled to a surface of, e.g., an integrated circuit chip, such that areas of different thermoelectric array densities align over different regions of the integrated circuit chip to optimally handle regions of higher and lower heat flux. This concept is illustrated, by way of example only, in the thermoelectric assembly/module embodiment of FIGS. 3A & 3B, discussed further below.

Figure 2A:
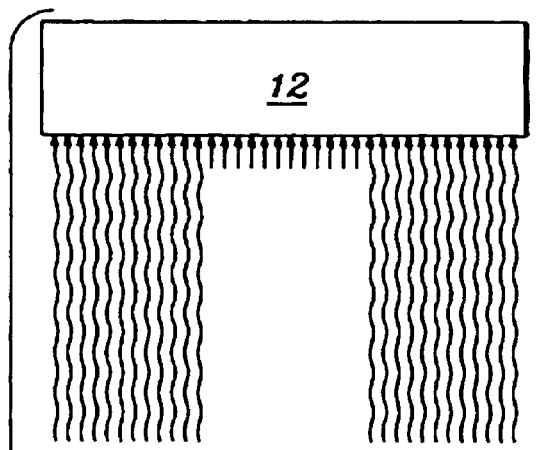
FIG. 2A is a side elevational view of one embodiment of an integrated circuit chip having a non-uniform heat flux across the chip.
Figure 2B:
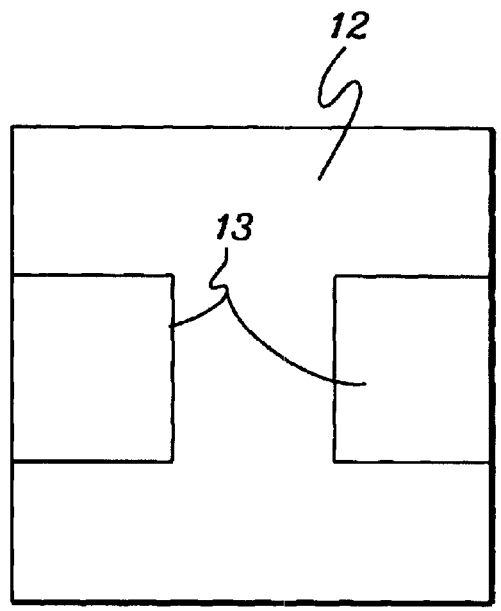
FIG. 2B is a plan view depiction of higher heat flux regions and lower heat flux regions of the integrated circuit chip of FIG. 2A.
Figure 2C:
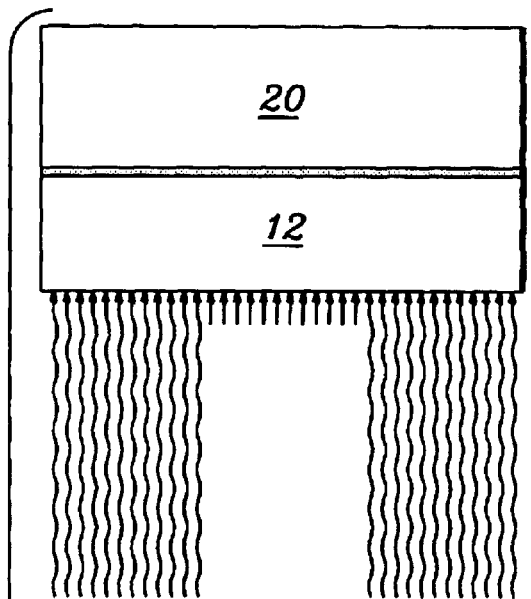
FIG. 2C is an elavational view of the integrated circuit chip of FIG. 2A with a thermal dissipation assembly affixed to a main surface thereof, in accordance with an aspect of the present invention.

Referring first to FIGS. 2A–2C, an integrated circuit chip 12 having two distinct high heat flux regions 13 is depicted in FIGS. 2A & 2B. As shown in FIG. 2B, the high heat flux regions 13 are located on opposite sides of the integrated circuit chip in this example. The heat flux in these regions can be up to 15 times greater than that of the remaining area of the chip as depicted by the arrows in FIG. 2A, which are representative of the heat flux from the different regions of the integrated circuit chips.

FIG. 2C depicts the integrated circuit chip of FIGS. 2A & 2B with a thermoelectric assembly 20 coupled thereto. Thermoelectric assembly 20 can be coupled to integrated circuit chip 12 via an interface layer, such as a thermally conductive paste.

Conventional thermoelectric designs have an array of thermoelectric elements or couples that are of uniform geometry, i.e., a consistent element (XY) area, pitch and thickness. In order to handle higher and higher heat fluxes, thermoelectric geometry continues to scale downward (i.e., to smaller and smaller dimensions). This concept is analogous to that associated with CMOS scaling. If one were to design a thermoelectric module to be used on a processor chip, and particularly a processor chip having memory integrated thereon, the higher heat flux regions would conventionally drive the geometry definition for the entire thermoelectric assembly. Elements would essentially be over designed for the lower heat flux regions, resulting in a more inefficient thermoelectric module.

Thus, in accordance with an aspect of the present invention, the thermoelectric assembly is designed with multiple areas of thermoelectric elements having different densities. These areas of thermoelectric elements are configured to map to the different thermal regions of the integrated circuit chip. Specifically, the areas of the thermoelectric assembly which have a higher density of thermoelectric elements (e.g., smaller dimensions and smaller pitch size) map to the regions of the integrated circuit chip which have the higher heat flux, and the areas of the thermoelectric assembly of lower thermoelectric element density (e.g., larger element size and/or pitch between elements) map to the regions of the integrated circuit chip of lower heat flux. The areas of higher density of thermoelectric elements provide greater cooling capacity and thus are mapped to the higher heat flux regions of the integrated circuit chip, while the areas of lower density thermoelectric elements are configured to map to the regions of the integrated circuit chip which have lower heat flux. If desired, a range of areas of thermoelectric elements of different densities could be provided within the thermoelectric assembly to map to a range of heat flux regions on an integrated circuit chip. Thus, the example of a high density region and a low density region is provided herein by way of example only.

Figure 3A:
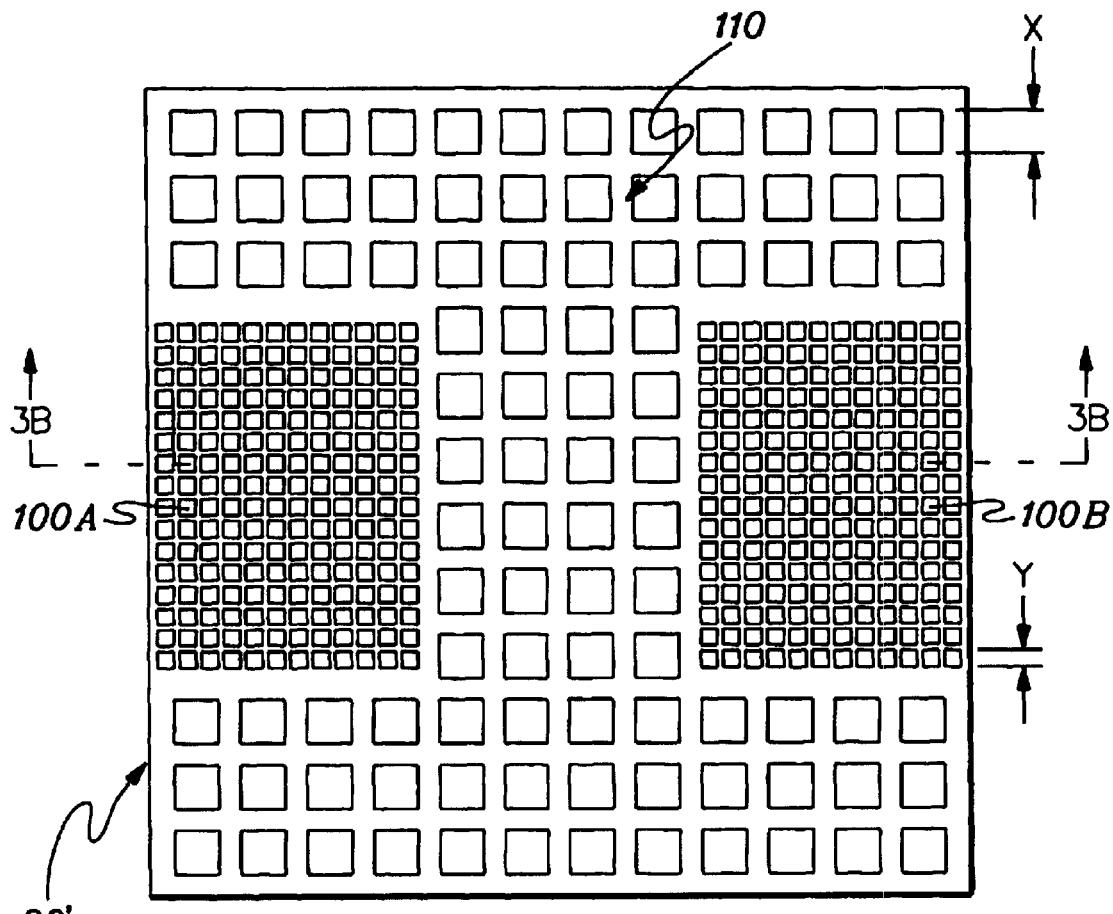
FIG. 3A is a plan view depiction of a thermoelectric assembly with an upper plate thereof removed to show different areas of thermoelectric elements with different densities, in accordance with an aspect of the present invention.
Figure 3B:
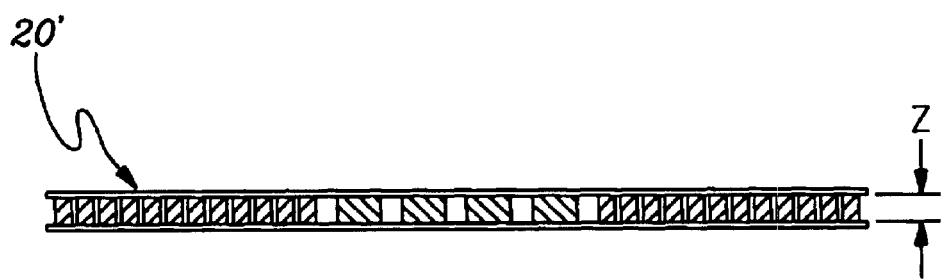
FIG. 3B is a cross-sectional elevational view of the thermoelectric assembly of FIG. 3A, with the upper plate positioned thereon, in accordance with an aspect of the present invention.

In the example of FIGS. 3A & 3B, two first areas 100A & 100B are identified having thermoelectric elements in a denser array than the thermoelectric elements disposed in a second area 110 of the thermoelectric assembly. In this example, the thermoelectric elements of the assembly are each assumed to have a square cross-sectional configuration and a common thickness, with the thermoelectric elements of the second area having a size (X) in the range of 0.5–1.0 mm and the thermoelectric elements in the multiple first areas of the assembly having a size (Y) in a range of 0.25–0.5 mm. These size ranges are provided by way of example only.

As shown in the cross-sectional, elevational view of FIG. 3B, the height (Z) of the thermoelectric elements in the different areas is the same, for example, 0.020 mm in one implementation. The number, shape and placement of the first area of denser thermoelectric elements within the assembly is dictated by the heat flux characteristics of the electronic device to which the thermoelectric assembly is to be attached. As shown in FIG. 3A, the first areas of denser thermoelectric elements in the assembly 100A & 100B substantially align with the first regions 13 of higher heat flux in the integrated circuit chip 12 example of FIG. 2B. The remaining area 110 of the thermoelectric assembly, having larger, less dense thermoelectric elements (and thus a lower cooling capacity), aligns with the second region of the integrated circuit chip having the lower relative heat flux (see FIG. 2B).

Those skilled in the art will note that provided herein is a thermoelectric assembly employing multiple element array regions of different density. Areas of greater density are configured to align to regions of higher heat flux from an electronic device to which the thermoelectric assembly to be attached. This allows for a lower circuit temperature for a given heat load to be established, and provides a more uniform temperature distribution across the electronic device (for example, integrated circuit chip). Further, there is a lower thermoelectric module power consumption, i.e., the thermoelectric assembly is more efficient compared with a thermoelectric module having uniform element geometry across the module.

Although preferred embodiments have been depicted and described in detail herein, it will be apparent to those skilled in the relevant art that various modifications, additions, substitutions and the like can be made without departing from the spirit of the are therefore considered to be within the scope of the invention as defined in the following claims.

What is claimed is:

1. A thermal dissipation assembly comprising:

a thermoelectric assembly configured to couple to a surface of a heat generating component, said heat generating component having a non-uniform thermal distribution across said surface thereof between at least one first region of said surface and at least one second region of said surface, wherein said at least one first region has higher heat flux than said at least one second region; and wherein said thermoelectric assembly includes at least one first area of thermoelectric elements and at least one second area of thermoelectric elements, said at least one first area of thermoelectric elements being configured for at least partial alignment to said at least one first region of higher heat flux when said thermoelectric assembly is coupled to said surface of said heat generating component, and said at least one second area of thermoelectric elements being configured for at least partial alignment to said at least one second region of lower heat flux when said thermoelectric assembly is coupled to said surface of said heat generating component, and wherein said at least one first area of thermoelectric elements comprises a greater density of thermoelectric elements than said at least one second area of thermoelectric elements.

2. The thermal dissipation assembly of claim 1, wherein said at least one first area of thermoelectric elements comprises cross-sectionally smaller thermoelectric elements than said at least one second area of thermoelectric elements.

3. The thermal dissipation assembly of claim 1, wherein said at least one first area of thermoelectric elements comprises a first array of thermoelectric elements and said at least one second area of thermoelectric elements comprises a second array of thermoelectric elements, and wherein said first array of thermoelectric elements has a smaller pitch than said second array of thermoelectric elements.

4. The thermal dissipation assembly of claim 1, wherein said heat generating component comprises an integrated circuit chip, and wherein said at least one first region of higher heat flux comprises at least one processor region, and said at least one first area of thermoelectric elements aligns with said at least one processor region when said thermoelectric assembly is coupled to said surface of said integrated circuit chip.

5. The thermal dissipation assembly of claim 1, wherein said thermoelectric assembly further comprises a first support plate and a second support plate between which said at least one first area of thermoelectric elements and said at least one second area of thermoelectric elements are disposed, and wherein said thermoelectric assembly comprises a thin-film thermoelectric assembly.

6. The thermal dissipation assembly of claim 5, wherein said first support plate is configured to couple to said surface of said heat generating component, and said second support plate is configured to couple to at least one of a thermally conductive cap, a thermal spreader or a heat sink for facilitating removal of heat from said thermoelectric assembly.

7. A cooled electronic module comprising:

an electronic device having a non-uniform thermal distribution across a surface thereof between at least one first region of said surface and at least one second region of said surface, wherein said at least one first region has higher heat flux than said at least one second region; and a thermoelectric assembly coupled to said surface of said electronic device, said thermoelectric assembly including at least one first area of thermoelectric elements and at least one second area of thermoelectric elements, said at least one first area of thermoelectric elements being aligned over said at least one first region of higher heat flux, and said at least one second area of thermoelectric elements being aligned over said at least one second region, wherein said at least one first area of thermoelectric elements comprises a greater density of thermoelectric elements than said at least one second area of thermoelectric elements.

8. The cooled electronic module of claim 7, wherein said at least one first area of thermoelectric elements comprises cross-sectionally smaller thermoelectric elements than said at least one second area of thermoelectric elements.

9. The cooled electronic module of claim 7, wherein said at least one first area of thermoelectric elements comprises a first array of thermoelectric elements and said at least one second area of thermoelectric elements comprises a second array of thermoelectric elements, and wherein said first array of thermoelectric elements has a smaller pitch than said second array of thermoelectric elements.

10. The cooled electronic module of claim 7, wherein said electronic device comprises an integrated circuit chip, and wherein said at least one first region of higher heat flux comprises at least one processor region, and said at least one first area of thermoelectric elements aligns with said at least one processor region.

11. The cooled electronic module of claim 7, wherein said thermoelectric assembly further comprises a first support plate and a second support plate between which said at least one first area of thermoelectric elements and said at least one second area of thermoelectric elements are disposed, and wherein said thermoelectric assembly comprises a thin-film thermoelectric assembly.

12. The cooled electronic module of claim 11, further comprising a housing surrounding said electronic device and said thermoelectric assembly, said housing sealing said electronic device and thermoelectric assembly from the ambient environment.

13. The cooled electronic module of claim 12, wherein said electronic module comprises a multichip module, said electronic device comprises multiple integrated circuit chips, and said thermoelectric assembly comprises multiple thermoelectric modules coupled to said multiple integrated chips, and wherein at least one thermoelectric module of said multiple thermoelectric modules comprises said first area of thermoelectric elements and said second area of thermoelectric elements.

14. The cooled electronic module of claim 12, wherein said first support plate is coupled to said surface of said electronic device, and said second support plate is coupled to at least one of a thermal spreader, a heat sink, or a thermally conductive cap of said housing for facilitating removal of heat from said thermoelectric assembly.

15. A method of fabricating a thermal dissipation assembly for an electronic device, said method comprising:

provic ing a thermoelectric assembly configured to couple to a surface of an electronic device, said electronic device having a non-uniform thermal distribution across said surface between at least one first region of said surface and at least one second region of said surface, wherein said at least one first region has a higher heat flux than said at least one second region; and wherein said providing of the thermoelectric assembly includes providing at least one first area of thermoelectric elements and at least one second area of thermoelectric elements, said at least one first area of thermoelectric elements being configured for at least partial alignment to said at least one first region of higher heat flux when said thermoelectric assembly is coupled to said surface of said electronic device, and said at least one second area of thermoelectric elements being configured for at least partial alignment to said at least one second region when the thermoelectric assembly is coupled to said surface of said electronic device, and wherein said at least one first area of thermoelectric elements comprises a greater density of thermoelectric elements than said at least one second area of thermoelectric elements.

16. The method of claim 15, wherein said providing further comprises providing the at least one first area of thermoelectric elements to comprise cross-sectionally smaller thermoelectric elements than said at least one second area of thermoelectric elements.

17. The method of claim 15, wherein said providing further comprises providing said at least one first area of thermoelectric elements as a first array of thermoelectric elements and said at least one second area of thermoelectric elements as a second array of thermoelectric elements, wherein said first array of thermoelectric elements has a smaller pitch than said second array of thermoelectric elements.

* * * * *

UNITED STATES PATENT AND TRADEMARK OFFICE
CERTIFICATE OF CORRECTION

PATENT NO. : 6,804,966 B1
DATED : October 19, 2004
INVENTOR(S) : Chu et al.

It is certified that error appears in the above-identified patent and that said Letters Patent is hereby corrected as shown below:

Column 3,
Line 64, delete the word "elavational" and insert -- elevational --

Column 5,
Line 49, insert a -- . -- after the word "itself"

Column 7,
Line 18, insert these words -- invention and these -- after the word "the" in the second instance Signed and Sealed this First Day of February, 2005

JON W. DUDAS
*Director of the United States Patent and Trademark Office*